United States Patent
Wang

(10) Patent No.: US 7,081,415 B2
(45) Date of Patent: Jul. 25, 2006

(54) METHOD OF DRY PLASMA ETCHING SEMICONDUCTOR MATERIALS

(75) Inventor: Jennifer Wang, Redondo Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 210 days.

(21) Appl. No.: 10/782,538

(22) Filed: Feb. 18, 2004

(65) Prior Publication Data

US 2005/0178740 A1    Aug. 18, 2005

(51) Int. Cl.
 *H01L 21/302* (2006.01)
(52) U.S. Cl. ............... 438/714; 438/710; 438/712; 216/72
(58) Field of Classification Search ........... 438/706, 438/710, 712, 714, 720, 29, 42; 216/67, 216/72
See application file for complete search history.

(56) References Cited

U.S. PATENT DOCUMENTS

| 5,624,529 A * | 4/1997 | Shul et al. ............... 438/718 |
| 6,289,030 B1 * | 9/2001 | Charles ............... 372/49.01 |
| 6,728,288 B1 * | 4/2004 | Funabashi et al. ........... 372/96 |
| 2002/0075922 A1 * | 6/2002 | Yoo et al. ............... 372/45 |

\* cited by examiner

*Primary Examiner*—Lan Vinh
(74) *Attorney, Agent, or Firm*—LaRiviere, Grubman & Payne, LLP

(57) ABSTRACT

A method of dry plasma etching a semiconductor structure (20), having at least one semiconductor material layer (21), on a semiconductor wafer (200), involving a dry plasma reaction gas mixture ($30_i$) being chemically selected for, and having an etch rate corresponding to, each semiconductor material layer (21); dividing the semiconductor structure (20) into a masked portion (23a) and an unmasked portion (23b); and sequentially exposing the unmasked portion (23b) of the semiconductor structure (20) to the dry plasma reaction gas mixture ($30_i$).

19 Claims, 4 Drawing Sheets

US 7,081,415 B2

METHOD OF DRY PLASMA ETCHING SEMICONDUCTOR MATERIALS

STATEMENT OF GOVERNMENT CONTRACT

This invention was made with Government support under Contract No. N00014-02-C-0473 awarded by the Office of Naval Research, Department of the Navy. The Government has certain rights in this invention.

TECHNICAL FIELD

The present invention relates to etching processes for semiconductor wafers. More particularly, the present invention relates to dry plasma etching processes for etching multiple layers of semiconductor material formed on a semiconductor wafer in order to produce vertical sidewall structures. Even more particularly, the present invention relates to non-overly-destructive dry plasma etching processes, i.e., those which damage neither the sidewalls of the semiconductor structures nor the surface of the semiconductor wafer.

BACKGROUND ART

Current art semiconductor wafer processing technologies, including materials such as gallium arsenide (GaAs) and indium phosphide (InP), require various methods, such as wet etching, for improving vertical sidewall structures. Historically, wet etching has involved immersion techniques and spray techniques. In wet etching by immersion, a wafer is immersed in a tank of etchant for a period of time, rinsed, and then spin-dried. In wet etching by spraying, a wafer is sprayed with an etchant, rinsed, and then dried. These wet etching techniques are only effective for semiconductor devices having feature sizes of greater than three microns. Unfortunately, these wet etching techniques tend to result in inchoate etching, over-etching, or undercutting problems. In addition, wet etching results in isotropic sloped sidewalls, require rinsing and drying steps, involves hazardous wet chemicals, and presents potential contamination.[1]

[1] Microchip Fabrication: A Practical Guide to Semiconductor Processing, 4th Ed., Peter Van Zant, pp. 256–263, Plasma Etch Gas Chart, FIG. 9.25 (McGraw-Hill, 2000).

Other related art wet etching processing technologies have conventionally used an etchant, such as difluorodichloromethane ($CCl_2F_2$) or Freon 12®, for processing GaAs with a trend toward using a combination of silicon tetrachloride and sulphur hexaflouride ($SiCl_4/SF_6$), a combination of silicon tetrachloride and nitrogen trifluoride ($SiCl_4/NF_3$), and a combination of silicon tetrachloride and carbon tetrafluoride ($SiCl_4/CF_4$) as the etchant. While no conventional etchant has been used for wet etching InP, a trend exists toward using a combination of methane and hydrogen ($CH_4/H_2$) or only hydrogen iodide, i.e., hydroidoic acid (HI) as the etchant.[2]

[2] Id., at 266.

However, these related art reaction gas combinations have been found to result in poor device quality. While etching any one layer of a multi-layer semiconductor structure in a related art device, these related art techniques also tend to have the effect of either prematurely self-terminating the etching of the multilayer semiconductor structure or over-etching the multilayer semiconductor structure, thereby inflicting damage on the surface of the semiconductor wafer, e.g., undercutting (mathematically positive slope profile) and metallization punch-through occurring on an upper surface of a semiconductor structure such as on an upper surface of a via.

Particularly, prior art FIG. 1 is a cross-sectional view of a plasma-etched semiconductor structure 10 having a mask 11 thereon deposited, wherein the reaction gas mixture comprises a combination of chlorine ($Cl_2$) and nitrogen ($N_2$) at a volume ratio of $3Cl_2:1N_2$, and wherein a conventional reaction chamber is used. The reaction chamber parameters typically used in this prior art are: a temperature value of 100° C.; a negative bias power value of 30 W; an inductively coupled power value of 500 W; and a pressure value of 5 mTorr. Experimental results have shown that the structure 10, which is formed on a semiconductor wafer 100 of a semiconductor device 1000, has sustained substantial sidewall 12 damage, i.e., an over-etched mask (excessive loss of $Si_xN_y$), a roughly tapered or sloped sidewall (mathematically negative slope profile), and wafer surface 13 damage, i.e., roughness, in accordance with the prior art.

Therefore, a long-felt need remains for a process that will selectively etch multiple layers of semiconductor material without prematurely self-terminating the etching nor over-etching the multilayer semiconductor structure, thereby eliminating damage on the surface of the semiconductor wafer, and thereby preventing damage to semiconductor structures such as emitters.

DISCLOSURE OF THE INVENTION

Accordingly, the present invention addresses the foregoing prior art problems in a "dry" plasma etching process that selectively etches multiple layers of semiconductor material, especially 3,5-semiconductor compound materials, without prematurely self-terminating the etching nor over-etching the multilayer semiconductor structure, thereby eliminating damage on the surface of the semiconductor wafer, and thereby preventing damage to other semiconductor structures such as emitters. In so doing, the present invention results in semiconductor devices having clean vertical sidewalls and clean wafer surfaces, i.e., without damage.

The present invention involves dry plasma etching, using gases and plasma energy, performed in sequential steps, i.e., iteratively, and in situ. In particular, the present invention uses planar dry plasma etching, rather than barrel dry plasma etching, to better achieve vertical sidewalls. In the present planar dry plasma etching, the wafer is disposed and grounded on a chuck in a reaction chamber. The present dry plasma reaction gas mixture is energized by powering an RF electrode and biasing the chuck; and the reaction is thereby driven for etching the devices on the wafer.

More particularly, the present method of dry plasma etching a semiconductor structure, having at least one semiconductor material layer, on a semiconductor wafer, involves the following steps: providing a dry plasma reaction gas mixture being chemically selected for, and having an etch rate corresponding to, each semiconductor material layer; dividing the semiconductor structure into a masked and an unmasked portion; and sequentially exposing the unmasked portion of the semiconductor structure to the dry plasma reaction gas mixture. Each corresponding semiconductor material layer is thereby selectively etched. Clean vertical sidewall portions corresponding to each semiconductor material layer are thereby produced. The semiconductor wafer then remains undamaged.

In an embodiment of the present invention, a semiconductor structure has a first semiconductor material layer, a second semiconductor layer, and a third semiconductor layer, all layers being formed from 3,5-semiconductor compound materials. An initial dry plasma reaction gas mixture is a combination of methane gas ($CH_4$) and hydrogen gas ($H_2$). Ideally, the initial dry plasma reaction gas mixture has a gas volume ratio of one (1) part $CH_4$ to four (4) parts $H_2$ (1$CH_4$:4$H_2$). A subsequent dry plasma reaction gas mixture is a combination of methane gas ($CH_4$) and hydrogen gas ($H_2$) and chlorine ($Cl_2$). The first semiconductor material layer is initially etched by using the initial dry plasma reaction gas mixture, i.e., the combination of methane gas ($CH_4$) and hydrogen gas ($H_2$). The second semiconductor material layer and the third semiconductor material layer are subsequently etched using the subsequent dry plasma reaction gas mixture, i.e., the combination of methane gas ($CH_4$) and hydrogen gas ($H_2$) and chlorine ($Cl_2$) By sequentially etching, i.e., iteratively etching, these semiconductor material layers, i.e., the stack, the etch rate of each subsequent dry plasma reaction gas mixture is greater than the etch rate of each previous dry plasma reaction gas mixture. In one embodiment of the present invention, the previous etch rate is less than one half of the subsequent etch rate.

While each subsequent semiconductor material layer can act as an etch-stop layer for each previous dry plasma reaction gas mixture, the present invention also encompasses an option as described in the foregoing embodiment, i.e., the same previous dry plasma reaction gas mixture may also be used to etch, either partially or entirely, through the thickness of a given subsequent semiconductor material layer, in which case such subsequent semiconductor material layer would not necessarily always act as an etch-stop layer. The present invention further encompasses various combinations of reactant gases, as herein disclosed, for the dry plasma reaction gas mixture as well as various sequences of semiconductor material layers, as herein disclosed, subject to the present etching method.

In one embodiment of the present invention, the semiconductor wafer is also 3,5-semiconductor compound material such as gallium arsenide (GaAs) or indium phosphide (InP) which is difficult to etch using conventional wet etching methods. However, by using the present invention dry plasma etching method, such 3,5-semiconductor compound materials are more readily and cleanly etched.

Advantages of the present invention include selective etching of multiple semiconductor material layers without a prematurely self-terminating etching step and eliminating any potential over-etching of the multilayer semiconductor structure. As such, damage to the semiconductor wafer is thereby prevented. Also, damage to other semiconductor structures, such as emitters, is thereby prevented. By preventing damage, semiconductor devices having clean vertical sidewalls are effected. Other features of the present invention are disclosed, or are apparent in the section entitled "Detailed Description of the Invention," disclosed, infra.

BRIEF DESCRIPTION OF THE DRAWING

For a better understanding of the present invention, reference is made to the below referenced accompanying Drawing. Reference numbers refer to the same or equivalent parts of the present invention throughout the several figures of the Drawing.

MODES FOR CARRYING OUT THE INVENTION

Figure 1:
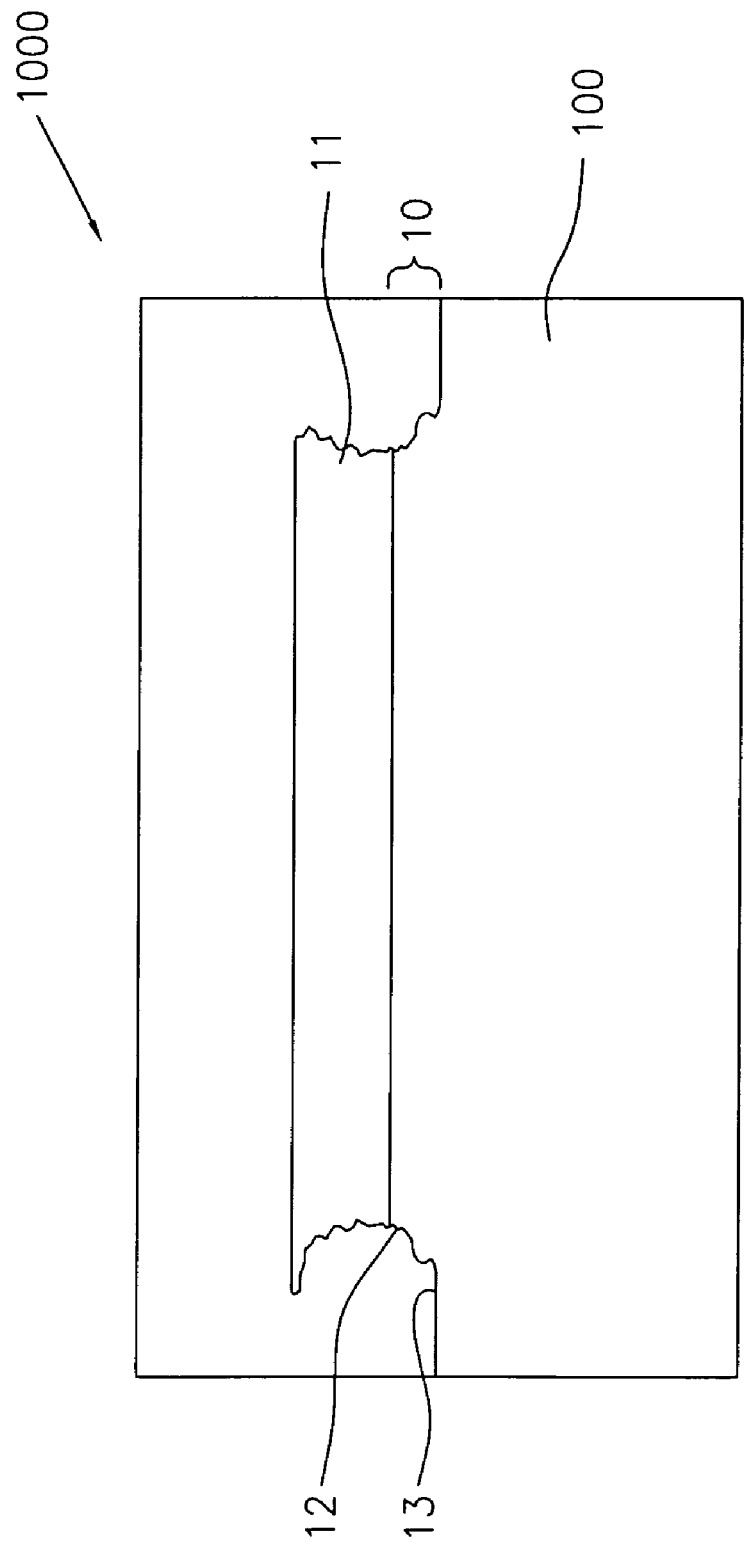
FIG. 1 is a cross-sectional view of a damaged plasma etched multilayer semiconductor structure of a semiconductor device using related art etchant gas combinations, in accordance with the prior art.
Figure 2:
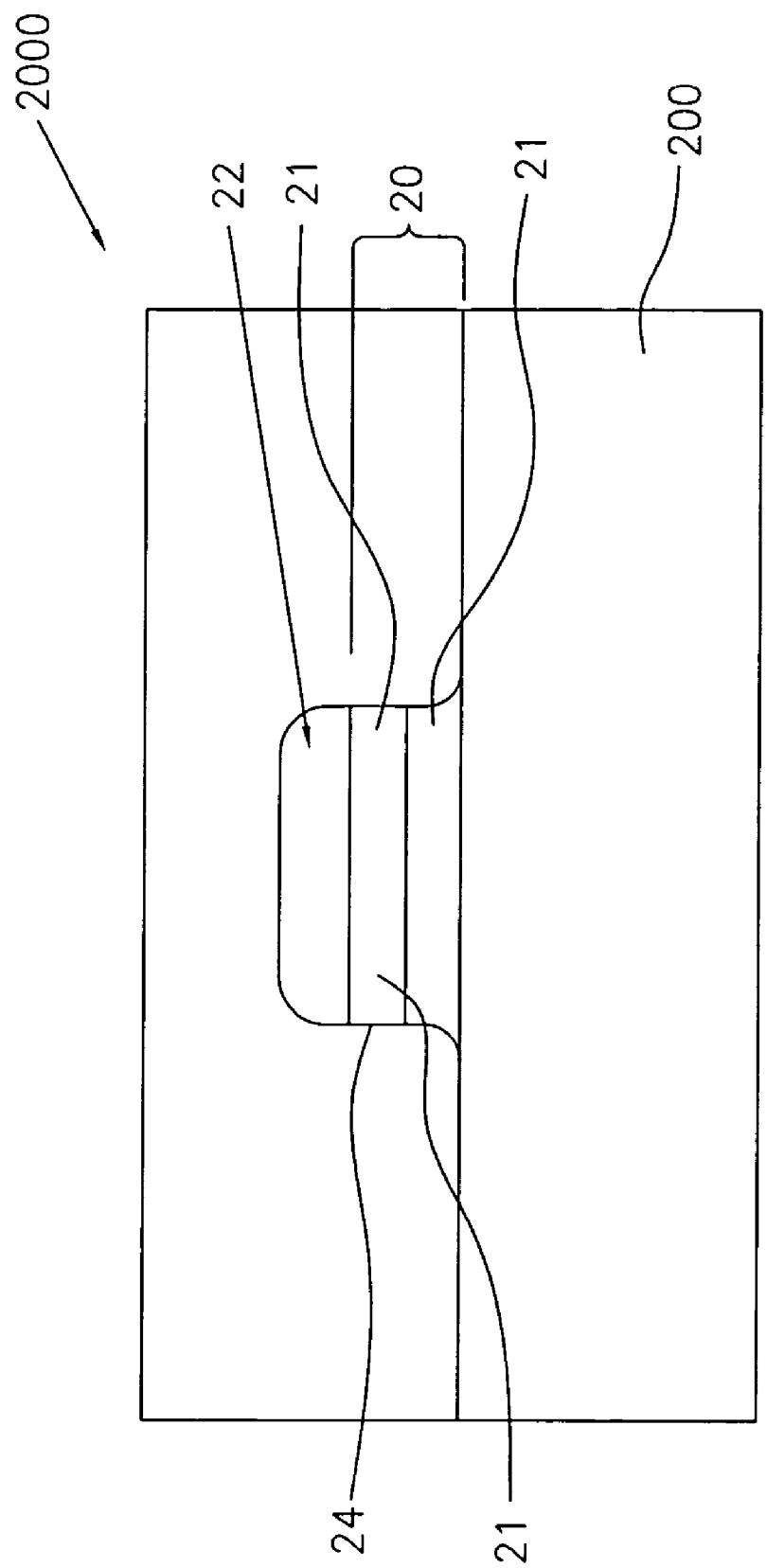
FIG. 2 is a cross-sectional view of a clean dry plasma etched multilayer semiconductor structure of a semiconductor device, in accordance with the present invention.

FIG. 2 illustrates, in a cross-sectional view, a dry plasma etched multilayer semiconductor structure 20 of a semiconductor device 2000, according to the present invention. Note that the semiconductor device 2000, having been etched by the present method is clean, i.e., without any sidewall 24 nor wafer surface 201 damage. Under previous processes in the related art, surface roughness and sloped sidewall problems occur. As such, the previous process problems are addressed by using the present invention dry plasma etching method M (as discussed, infra) that selectively etches multiple layers of semiconductor material 21 without a prematurely self-terminating etching step nor an over-etching of the multilayer semiconductor structure 20. This being so, damage on the surface of the semiconductor wafer 200 is thereby eliminated. Also, damage to other semiconductor structures, such as emitters (not shown), is thereby prevented. Thus, the present invention results in semiconductor devices 2000 having smooth clean vertical sidewalls 24 and smooth clean wafer surfaces 201.

Figure 3:
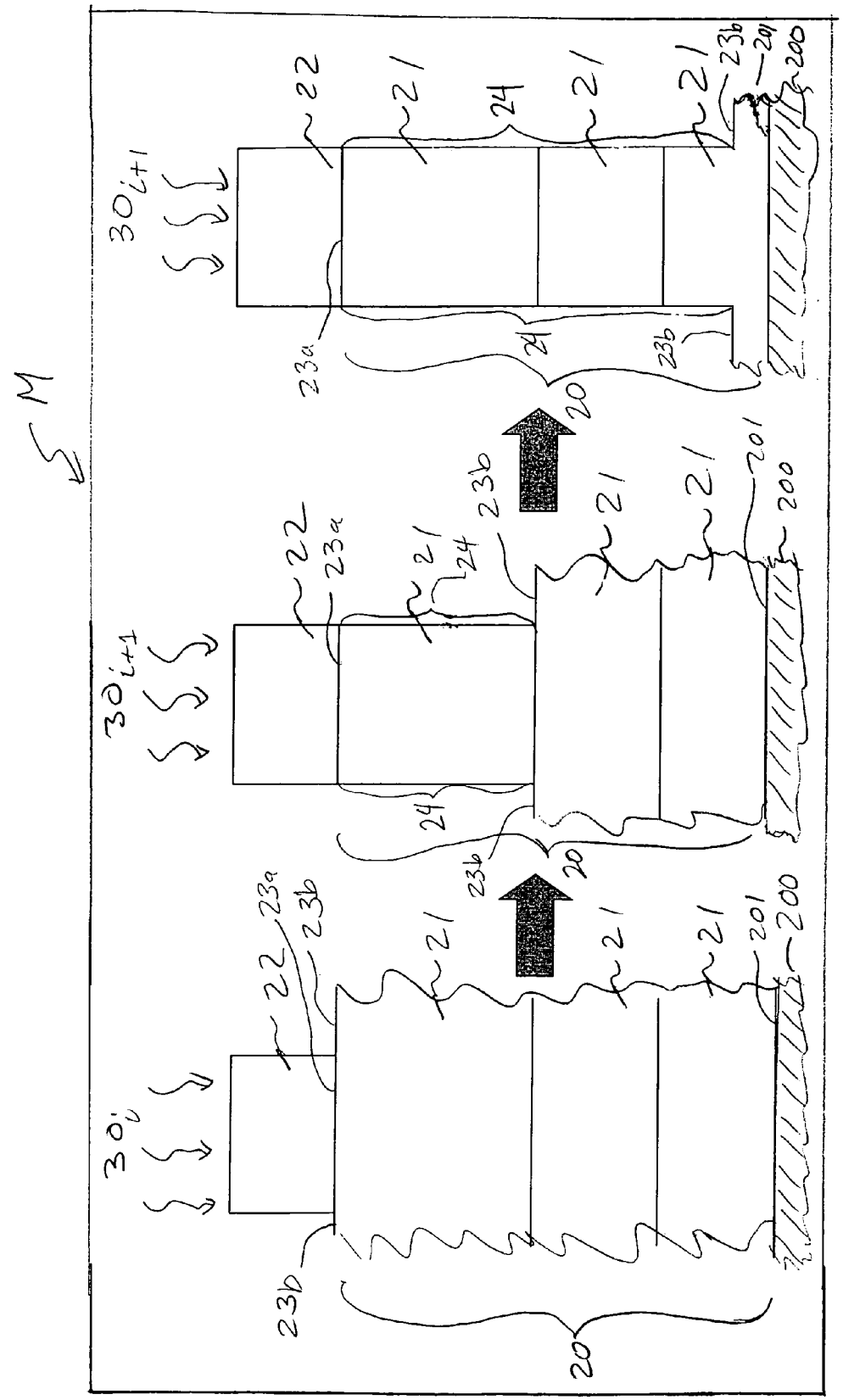
FIG. 3 is a schematic representation illustrating a method of dry plasma etching a semiconductor structure, in accordance with the present invention.

FIG. 3 illustrates, in a schematic diagram, the general process steps of a method M for dry plasma etching, i.e., sequentially etching, a semiconductor structure 20 (multilayer), having at least one semiconductor material layer 21, on a semiconductor wafer 200 of a semiconductor device 2000, in accordance with the present invention. The present method M of dry plasma etching a semiconductor structure 20, having at least one semiconductor material layer 21, on a semiconductor wafer 200, generally involves the steps of providing a dry plasma reaction gas mixture $30_i$ being chemically selected for, and having an etch rate corresponding to, each semiconductor material layer 21; dividing the semiconductor structure 20 into a masked portion 23a (by depositing a mask 22) and an unmasked portion 23b; and sequentially exposing the unmasked portion 23b of the semiconductor structure 20 to the dry plasma reaction gas mixture $30i$. In so doing, each corresponding semiconductor material layer 21 is thereby selectively etched. Also, clean vertical sidewall portions 24 corresponding to each semiconductor material layer 21 are thereby produced. Thus, the semiconductor wafer 200, especially the wafer surface 201, remains undamaged. The mask 22 is formed from a material such as silicon nitride ($Si_xN_y$), silicon oxide ($Si_xO_y$), a photoresist, and other metals, e.g., chromium (Cr) and nickel (Ni).

EXAMPLE 1

In an embodiment of the present invention, an initial dry plasma reaction gas mixture $30i$ is a combination of methane gas ($CH_4$) and hydrogen gas ($H_2$). Ideally, the initial dry plasma reaction gas mixture $30_i$ has a gas volume ratio of one (1) part $CH_4$ to four (4) parts $H_2$ (1$CH_4$:4$H_2$). A subsequent dry plasma reaction gas mixture $30_{i+1}$ has the composition of the initial gas reaction mixture $30_i$ but further includes chlorine ($Cl_2$). The subsequent dry plasma reaction gas mixture $30_{i+1}$ volume ratio has a combined $CH_4$ and $H_2$ gas mixture volume which is greater than that of the $Cl_2$ volume. In this embodiment, such subsequent dry plasma reaction gas mixture $30_{i+1}$ has a gas volume ratio of one (1) part $CH_4$ to four (4) parts $H_2$ to three (3) parts $Cl_2$ ($1CH_4$: $4H_2$:$3Cl_2$). The etch rate of each subsequent dry plasma reaction gas mixture $30_{i+1}$ is greater than the etch rate of each previous reaction gas mixture $30_i$. In the preferred embodiment, the previous etch rate less than one half of the subsequent etch rate. Further, each subsequent semiconductor material layer 21 acts as an etch-stop layer for each previous dry plasma reaction gas mixture $30_i$.

As generally discussed, supra, while each subsequent semiconductor material layer 21 can act as an etch-stop layer for each previous dry plasma reaction gas mixture $30_i$, the present invention also encompasses an option as described in the foregoing embodiment, i.e., the same previous dry plasma reaction gas mixture $30_i$ may also be used to etch, either partially or entirely, through the thickness of a given subsequent semiconductor material layer 21, in which case such subsequent semiconductor material layer 21 would not necessarily always act as an etch-stop layer. The present invention further encompasses various combinations of reactant gases, as herein disclosed, for the dry plasma reaction gas mixture 30 as well as various sequences of semiconductor material layers 21, as herein disclosed, subject to the present etching method.

EXAMPLE 2

In another embodiment, the semiconductor wafer 200 is formed from a 3,5-semiconductor compound material such as gallium arsenide (GaAs) or indium phosphide (InP). Each semiconductor material layer 21 may be distinct from one another. As such, each semiconductor material layer 21 is also formed from a 3,5-semiconductor compound material such as indium gallium arsenide (InGaAs), indium aluminum arsenide (InAlAs), or indium phosphide (InP). The semiconductor material layer 21 can be contemporaneously etched in situ, i.e., in the same reaction chamber, preferably a Unaxis® Model SLR ICP-LN2 reaction chamber for example only, within the sequentially exposing step. The sequentially exposing step involves the following parameter ranges: a temperature range for the chuck of approximately 10° C. to approximately 30° C., preferably approximately 20° C., i.e., room temperature, for providing greater convenience and lower cost; a negative bias power range of approximately 30 W to approximately 100 W, preferably approximately 55 W to approximately 75 W, for decreasing the potential for any damage to the device while also being sufficient for driving the plasma reaction; an inductively coupled power range of approximately 120 W to approximately 170 W, preferably approximately 145 W to approximately 160 W, for driving the plasma reaction as well as for controlling the ion flux; and a pressure range of approximately 2 mTorr to approximately 7 mTorr, preferably approximately 3 mTorr to approximately 6 mTorr, for providing increased anisotropic etching to efficiently effect vertical sidewalls.

By example only, the present invention involves the foregoing dry plasma reaction gas mixture and 3,5-semiconductor compound materials in combination with using an inductively coupled plasma (ICP) etching system (reaction chamber), wherein an RF current, driven at 2 MHz, is supplied to the three coils in opposite directions, whereby an alternating magnetic field in the upward and the downward directions is induced. The magnetic field's change rate, in turn, induces an RF electric field which confines and accelerates electrons in a circular path. By applying the foregoing parameter ranges in the present invention, such inductive coupling is highly efficient and creates a very high density dry plasma. Since the electrons are confined in the circular path, the probability of their reaching the sample chuck is minimized, thereby resulting in a low DC self-bias. Another source, driven at 13.56 MHz, for example, is applied to the chuck for controlling the DC bias, thereby allowing independent control of both the ion flux, i.e., the ICP power to the coils, and ion energy, i.e., the RF power to the chuck. Since ICP tools do not use microwave sources nor magnets for collimating the plasma, they offer some advantages such as simpler tuning and lower cost. The present invention, using an ICP tool, as well as any other high density plasma tool, provides a higher etching rate arising from the higher concentration of ions and free radicals. Also, because the electrons are confined in the circular path, few are lost to the walls or to the electrode in comparison to the conventional reactive ion etching (RIE) systems, thereby resulting in a relatively lower DC bias and in less ion damage.

EXAMPLE 3

In a preferred embodiment, a first semiconductor material layer, such as layer 21, including a 3,5-semiconductor compound material such as indium gallium arsenide, gallium arsenide, aluminum gallium arsenide, and indium phosphide, is etched by a first dry plasma reaction gas mixture $30_i$ being $CH_4/H_2$, wherein a reaction $InGa_nAs_{1-n}+CH_4/H_2 \rightarrow In(CH_3)_x\uparrow+Ga(CH_3)_x\uparrow+AsH_3\uparrow$ occurs, wherein n=a fraction in the range of approximately 0.3 to approximately 0.6 and x=an integer such as 1, 2, or 3, and whereby resultant species are volatilized; a second semiconductor material layer, such as layer 21, including a 3,5-semiconductor compound material such as indium aluminum arsenide, indium gallium arsenic phosphide, indium phosphide, and aluminum gallium arsenide, is etched by a second dry plasma reaction gas mixture $30_2$, being $CH_4/H_2/Cl_2$, i.e., by adding $Cl_2$ to the $CH_4/H_2$ gas mixture, wherein a reaction $InAl_nAs_{1-n}+CH_4/H_2/Cl_2 \rightarrow In(CH_3)_x\uparrow+As(CH_3)_x\uparrow+AlCl_3\uparrow$ occurs, wherein n=a fraction in the range of approximately 0.3 to approximately 0.6 and x=an integer such as 1, 2, or 3, and whereby resultant species are volatilized; and a third semiconductor material layer, such as layer 21, including a 3,5-semiconductor compound material such as indium phosphide (InP), is etched by the same second dry plasma reaction gas mixture $30_{i+1}$, being $CH_4/H_2/Cl_2$, wherein a reaction $InP+CH_4/H_2/Cl_2 \rightarrow In(CH_3)_x\uparrow+PH_3\uparrow$ occurs, wherein x=an integer such as 1, 2, or 3, whereby resultant species are volatilized. The resultant volatilized species are then pumped from the reaction chamber, such as one noted in the previous example, along with any excess unreacted gas mixture. The boiling point for volatilizing the resultant species is approximately 188° C. All dry plasma etching (iterations) is performed in situ. The present dry plasma reaction gas mixture $30_{i+1}$, having a synergistic combination of ionic species, is more highly reactive than would be each of the reagent gases, if used alone, with respect to the foregoing 3,5-semiconductor materials. In particular, the same dry plasma reaction gas mixture $30_{i+1}$, including the original $CH_4/H_2/Cl_2$ volume ratios i.e., without further altering the $Cl_2$ concentration, is used for etching the second semiconductor layer as well as the third semiconductor layer in the preferred embodiment. The etching depth in the third semiconductor layer, including InP, is limited by controlling the etching duration.

EXAMPLE 4

Figure 4:
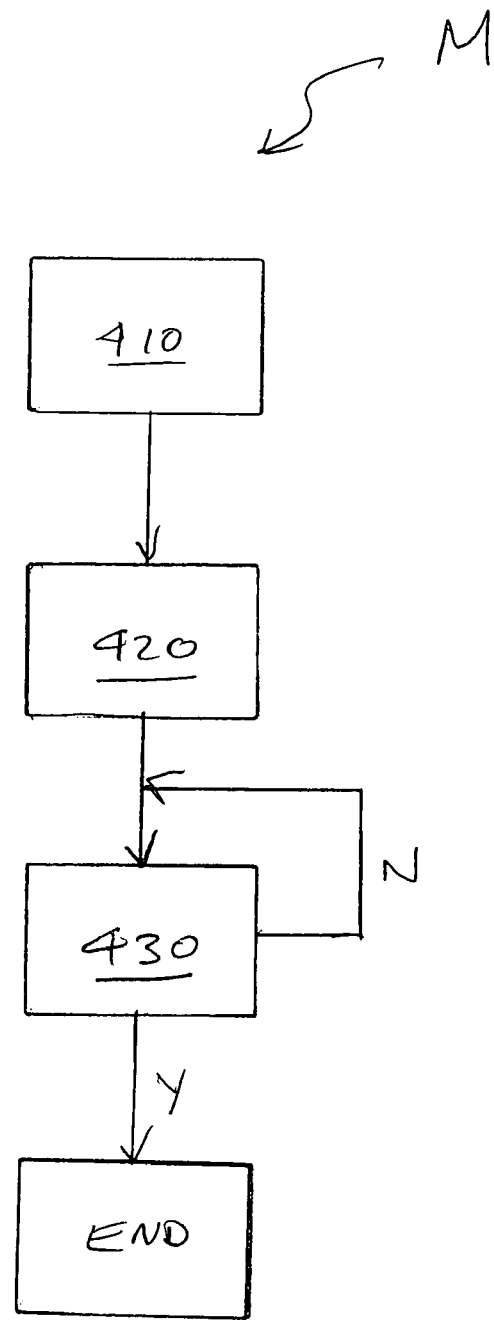
FIG. 4 is a flowchart of a method of dry plasma etching a semiconductor structure, in accordance with the present invention.

FIG. 4 illustrates, in a flowchart, the method M specifically involves providing a dry plasma reaction gas mixture $30_i$ being chemically selected for, and having an etch rate corresponding to, each semiconductor material layer 21, as indicated by block 410; dividing the semiconductor structure 20 into a masked portion 23a (by depositing a mask 22) and an unmasked portion 23b, as indicated by block 420; and sequentially exposing the unmasked portion 23b of the semiconductor structure 20 to the dry plasma reaction gas mixture $30_i$, as indicated by block 430, wherein the sequentially exposing step comprises analyzing the semiconductor structure 20 for determining whether a desired vertical sidewall profile has been achieved. If the sidewall has not yet reached a vertical profile, then the sequentially exposing step will be repeated, as shown by block 430. If the sidewall has reached a desired vertical profile, then the sequentially exposing step will not be repeated and the process will end, as shown by the "END" block.

Information, as herein shown and described in detail, is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, various changes and modifications in form and fabrication material detail that may be made without departing from the spirit and scope of the inventions as set forth in the appended claims should be readily apparent to those of ordinary skill in the art. No claim herein is to be construed under the provisions of 35 U.S.C. § 112, sixth paragraph, unless the element is expressly recited using the phrase "means for."

INDUSTRIAL APPLICABILITY

The present invention applies industrially to etching processes for semiconductor wafers. More particularly, the present invention applies industrially to dry plasma etching processes for etching multiple layers of semiconductor material formed on a semiconductor wafer in order to produce vertical sidewall structures. Even more particularly, the present invention applies industrially to non-overly-destructive dry plasma etching processes, i.e., those which damage neither the sidewalls of the semiconductor structure nor the surface of the semiconductor wafer.

What is claimed:

1. A method of dry plasma etching a semiconductor structure, having a plurality of separately distinct semiconductor material layers on a semiconductor wafer, comprising:
    sequentially providing a plurality of dry plasma reaction gas mixtures, each such mixture being chemically selected for, and having an etch rate corresponding to, each semiconductor material layer, the etch rate of each subsequent dry plasma reaction gas mixture being greater than the etch rate of each previous dry plasma reaction gas mixture;
    dividing the semiconductor structure into a masked portion and an unmasked portion; and
    sequentially exposing the unmasked portion of the semiconductor structure to the dry plasma reaction gas mixtures.

2. A method, as recited in claim 1, wherein the step of providing the dry plasma reaction gas mixture comprises:
    providing a first dry plasma reaction gas mixture;
    providing a second dry plasma reaction gas mixture; and
    providing a third dry plasma reaction gas mixture, and
    wherein the etch rate of each subsequent dry plasma reaction gas mixture is greater than the etch rate of each previous dry plasma reaction gas mixture.

3. A method, as recited in claim 1, wherein the step of sequentially exposing the unmasked portion of the semiconductor structure to the dry plasma reaction gas mixture comprises a technique selected from the group consisting essentially of:
    (a) exposing the unmasked portion of the semiconductor structure to each given dry plasma reaction gas mixture such that each given subsequent semiconductor material layer acts as an etch-stop layer for each previous dry plasma reaction gas mixture; and
    (b) exposing the unmasked portion of the semiconductor structure to the same given previous dry plasma reaction gas mixture such that a given subsequent semiconductor material layer is also etched.

4. A method, as recited in claim 1, wherein the semiconductor wafer comprises a material selected from the group consisting essentially of gallium arsenide and indium phosphide.

5. A method, as recited in claim 1, wherein the semiconductor material layer comprises a material selected from the group consisting essentially of indium gallium arsenide, gallium arsenide, indium aluminum arsenide, aluminum gallium arsenide, indium gallium arsenic phosphide, and indium phosphide.

6. A method, as recited in claim 1, wherein the sequentially exposing step comprises contemporaneously etching the at least one semiconductor material layer in situ.

7. A method, as recited in claim 1, wherein the sequentially exposing step comprises using a temperature range of approximately 10° C. to approximately 30° C.

8. A method, as recited in claim 1, wherein the sequentially exposing step comprises using a negative bias power range of approximately 30 W to approximately 100 W.

9. A method, as recited in claim 1, wherein the sequentially exposing step comprises using an inductively coupled power range of approximately 120 W to approximately 170 W.

10. A method, as recited in claim 1, wherein the sequentially exposing step comprises using a pressure range of approximately 2 mTorr to approximately 7 mTorr.

11. A method, as recited in claim 1, wherein the sequentially exposing step comprises:

analyzing the semiconductor structure for determining whether a desired vertical sidewall profile has been achieved; and repeating the sequentially exposing step, if necessary, until the desired vertical sidewall profile has been achieved.

12. A method, as recited in claim 1, wherein the semiconductor structure comprises:

a first semiconductor material layer including indium gallium arsenide ($InGa_nAs_{1-n}$);

a second semiconductor material layer including indium aluminum arsenide ($InAl_nAs_{1-n}$); and a third semiconductor material layer including indium phosphide (InP), and wherein the sequentially exposing step is performed in situ and comprises:

initially exposing the first semiconductor material layer to a first dry plasma reaction gas mixture, comprising $CH_4/H_2$, wherein a reaction $InGa_nAs_{1-n}+CH_4/H_2 \rightarrow In(CH_3)_x\uparrow + Ga(CH_3)_x\uparrow + AsH_3\uparrow$ occurs, wherein n=a fraction in the range of approximately 0.3 to approximately 0.6 and x=an integer such as 1, 2, or 3, and whereby resultant species are volatilized;

subsequently exposing the second semiconductor layer to a second reaction gas mixture, comprising $CH_4/H_2/Cl_2$, wherein a reaction $InAl_nAs_{1-n}+CH_4/H_2/Cl_2 \rightarrow In(CH_3)_x\uparrow + As(CH_3)_x\uparrow + AlCl_3\uparrow$ occurs, wherein n=a fraction in the range of approximately 0.3 to approximately 0.6 and x=an integer such as 1, 2, or 3, and whereby resultant species are volatilized; and finally exposing the third semiconductor layer to the same second reaction gas mixture, wherein a reaction $InP+CH_4/H_2/Cl_2 \rightarrow In(CH_3)_x\uparrow + PH_3\uparrow$ occurs, wherein x=an integer such as 1, 2, or 3, and whereby resultant species are volatilized.

13. A method, as recited in claim 1, wherein the dry plasma reaction gas mixture comprises methane gas and hydrogen gas.

14. A method, as recited in claim 13, wherein the dry plasma reaction gas mixture comprises a gas volume ratio of one (1) part methane gas to four (4) parts hydrogen gas.

15. A method, as recited in claim 13, wherein the dry plasma reaction gas mixture further comprises chlorine.

16. A method, as recited in claim 15, wherein the dry plasma reaction gas mixture ratio comprises a combined methane gas and hydrogen gas mixture volume which is greater than that of the chlorine.

17. A method, as recited in claim 16, wherein the dry plasma reaction gas mixture comprises a gas volume ratio of one (1) part methane gas to four (4) parts hydrogen gas to three (3) parts chlorine.

18. A method of dry plasma etching a semiconductor structure, having at least one semiconductor material layer, on a semiconductor wafer, comprising:

providing a dry plasma reaction gas mixture being chemically selected for, and having an etch rate corresponding to, each semiconductor material layer;

wherein the step of providing the dry plasma reaction gas mixture further comprises providing an initial dry plasma reaction gas mixture, and providing a subsequent dry plasma reaction gas mixture, wherein the etch rate of the subsequent dry plasma reaction gas mixture is greater than the etch rate of the initial dry plasma reaction gas mixture;

dividing the semiconductor structure into a masked portion and an unmasked portion; and sequentially exposing the unmasked portion of the semiconductor structure to the dry plasma reaction gas mixture, wherein the initial dry plasma reaction gas mixture comprises methane gas and hydrogen gas, and wherein the subsequent dry plasma reaction gas mixture comprises methane gas, hydrogen gas, and chlorine.

19. A method of dry plasma etching a semiconductor structure, having at least one semiconductor material layer, on a semiconductor wafer, comprising:

providing a dry plasma reaction gas mixture being chemically selected for, and having an etch rate corresponding to, each semiconductor material layer;

wherein the step of providing the dry plasma reaction gas mixture further comprises providing a first dry plasma reaction gas mixture, providing a second dry plasma reaction gas mixture, and providing a third dry plasma reaction gas mixture, wherein the etch rate of each subsequent dry plasma reaction gas mixture is greater than the etch rate of each previous dry plasma reaction gas mixture;

dividing the semiconductor structure into a masked portion and an unmasked portion; and sequentially exposing the unmasked portion of the semiconductor structure to the dry plasma reaction gas mixture, wherein the at least one semiconductor material layer comprises a material selected from the group consisting essentially of indium gallium arsenide, gallium arsenide, indium aluminum arsenide, aluminum gallium arsenide, indium gallium arsenic phosphide, and indium phosphide.

* * * * *